United States Patent
Tai et al.

(10) Patent No.: US 9,136,816 B2
(45) Date of Patent: Sep. 15, 2015

(54) WIDE-BAND COMMON MODE FILTERING APPARATUS

(71) Applicant: INPAQ TECHNOLOGY CO., LTD., Miaoli (TW)

(72) Inventors: Shin Min Tai, Taoyuan County (TW); Chien Heng Chen, Kaohsiung (TW); Wei Chuan Chen, Taoyuan County (TW); Yu Chia Chang, Taichung (TW)

(73) Assignee: INPAQ TECHNOLOGY CO., LTD., Miaoli (TW)

( * ) Notice: Subject to any disclaimer, the term of this patent is extended or adjusted under 35 U.S.C. 154(b) by 288 days.

(21) Appl. No.: 13/828,756

(22) Filed: Mar. 14, 2013

(65) Prior Publication Data

US 2014/0266504 A1    Sep. 18, 2014

(51) Int. Cl.
*H03H 7/01* (2006.01)
*H03H 7/42* (2006.01)

(52) U.S. Cl.
CPC .............. *H03H 7/427* (2013.01); *H03H 7/0138* (2013.01)

(58) Field of Classification Search
CPC ........ H03H 7/427; H03H 7/0138; H03H 7/01
USPC .............................. 333/168, 181, 177; 361/56
See application file for complete search history.

(56) References Cited

FOREIGN PATENT DOCUMENTS

JP    2011-228824 A  * 11/2011
JP    2012-160810 A  *  8/2012

OTHER PUBLICATIONS

English Translation of JP, 2011-228824, A Feb. 18, 2015.*
English Translation of JP, 2012-160810, A Feb. 18, 2015.*

* cited by examiner

*Primary Examiner* — Stephen E Jones
*Assistant Examiner* — Erfan Faneian
(74) *Attorney, Agent, or Firm* — WPAT, P.C.; Anthony King

(57) ABSTRACT

A wide-band common mode filtering apparatus includes at least two cascaded common mode filters with different noise-filtering responses, wherein the cut-off frequency of the wide-band common mode filtering apparatus is at the lowest cut-off frequency of the common mode filters, and the noise-filtering response of the wide-band common mode filtering apparatus is the superposition of the noise-filtering responses of the common mode filters. In one embodiment of the present invention, the wide-band common mode filtering apparatus includes a first common mode filter having a first filtering band, and a second common mode filter having a second filtering band different from the first filtering band. The disclosure of the present technique allows the cascaded common mode filters with different filtering bands to form the wide-band common mode filtering apparatus having an overall filtering band to meeting a new demand.

10 Claims, 3 Drawing Sheets

WIDE-BAND COMMON MODE FILTERING APPARATUS

FIELD OF THE INVENTION

The present invention relates to the field of a wide-band common mode filtering apparatus, and more particularly, to a wide-band common mode filtering apparatus including at least two cascaded common mode filters with different noise-filtering responses.

DISCUSSION OF THE BACKGROUND

As the development of network communication and digital data transmission has progressed towards higher transmission rates, the differential transmission technique has been widely utilized in several industrial transmission protocols such as Universal Serial Bus (USB), IEEE-1394, low-voltage differential signaling (LVDS), Digital Visual Interface (DVI), High-Definition Multimedia Interface (HDMI), and Mobile Industry Processor Interface (MIPI).

Common mode noise is conducted on all lines in the same direction, and common mode filters can be used to suppress common mode noise on any line on which such noise is conducted. Traditionally, a common mode filter is comprised of components including an iron core and two coils wound around the iron core with the same winding number. When a common mode current flows through the common mode filter, the two coils generate a magnetic flux in the same direction such that the common mode filter exhibits high impedance and can suppress common mode noise.

To address the requirement of portable electronic apparatuses, thin film common mode filters have been developed. The conventional thin film common mode filter includes two coil conductor layers, two lead-out electrode layers, a plurality of insulation layers, and two magnetic layers. Each coil conductor layer includes a coil, and the two lead-out electrode layers are used to extend the inner ends of the two coils to an edge of the thin film common mode filter for an external electrical connection. Several insulation layers are used for electrically insulating the coil conductor layers and the lead-out electrode layers. The coil conductor layers, the lead-out electrode layers, and the insulation layers are disposed between two magnetic layers. However, after completing the fabrication process, the filtering band of the conventional common mode filter is fixed and cannot be expanded. To meet the requirements of a new filtering band, a redesign and re-fabrication process are needed.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

BRIEF SUMMARY

One aspect of the present invention discloses a wide-band common mode filtering apparatus, comprising at least two cascaded common mode filters with different noise-filtering responses, wherein a cut-off frequency of the wide-band common mode filtering apparatus is at a lowest cut-off frequency of the at least two common mode filters, and a noise-filtering response of the wide-band common mode filtering apparatus is a superposition of the noise-filtering responses of the at least two common mode filters After completing the fabrication process, the filtering band of the conventional common mode filter is fixed and cannot be expanded. In contrast, the wide-band common mode filtering apparatus disclosed in the embodiment of the present invention comprises at least two cascaded common mode filters with different noise-filtering responses, and the overall filtering band of the wide-band common mode filtering apparatus is the superposition of the noise-filtering responses of the least two cascaded common mode filters. As a result, the overall filtering band is wider than the individual filtering band of the common mode filter.

Furthermore, to meet the requirements of a new filtering band, the conventional common mode filter needs to be redesigned and re-fabricated. In contrast, the wide-band common mode filtering apparatus disclosed in the embodiment of the present invention has an overall frequency response different from the frequency responses of the at least two cascaded common mode filters by way of the superposition of the individual frequency responses. In other words, the present disclosure can implement a new frequency response by cascading the common mode filters with desired frequency responses to meet the new requirement, and without conducting a redesign and re-fabrication process.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a wide-band common mode filtering apparatus including at least two cascaded common mode filters with different noise-filtering responses. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

Figure 1:
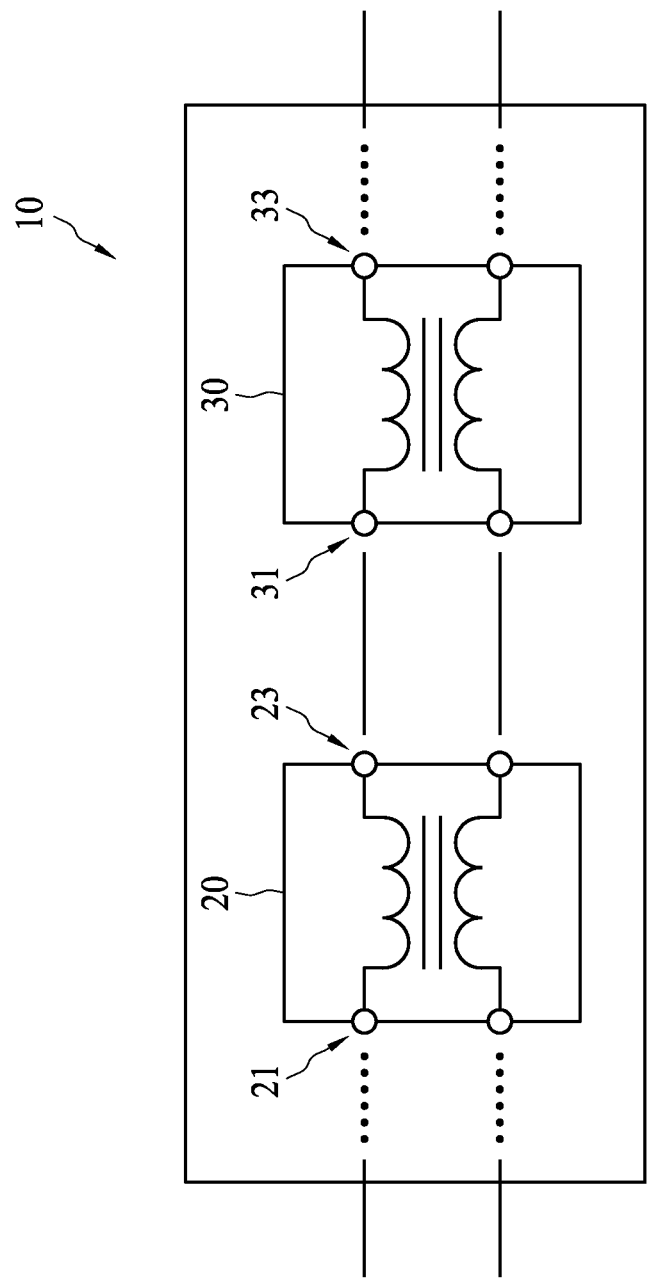
FIG. 1 illustrates a wide-band common mode filtering apparatus according to one embodiment of the present invention.

FIG. 1 illustrates a wide-band common mode filtering apparatus 10 according to one embodiment of the present invention. In one embodiment of the present invention, the wide-band common mode filtering apparatus 10 comprises at least two cascaded common mode filters with different noise-filtering responses. The cut-off frequency of the wide-band common mode filtering apparatus 10 is at the lowest cut-off frequency of the common mode filters, and the noise-filtering response of the wide-band common mode filtering apparatus 10 is the superposition of the noise-filtering responses of the common mode filters.

In one embodiment of the present invention, the wide-band common mode filtering apparatus 10 comprises a first common mode filter 20 and a second common mode filter 30, and the first common mode filter 20 is cascaded to the second common mode filter 30. In one embodiment of the present invention, the first common mode filter 20 comprises a first pair of inputs 21 and a first pair of outputs 23, the second common mode filter 30 comprises a second pair of inputs 31 and a second pair of outputs 33, and the second pair of inputs 31 is connected to the first pair of outputs 23.

In another embodiment of the present invention, the wide-band common mode filtering apparatus 10 further comprises a third common mode filter (not shown in the drawings) having a third filtering band, wherein the third common mode filter is cascaded to the second common mode filter, and the third filtering band is different from the second filtering band. Furthermore, the third common mode filter comprises a third pair of inputs and a third pair of outputs, wherein the third pair of inputs is connected to the second pair of outputs and the third filtering band overlaps a portion of the second filtering band.

Figure 2:
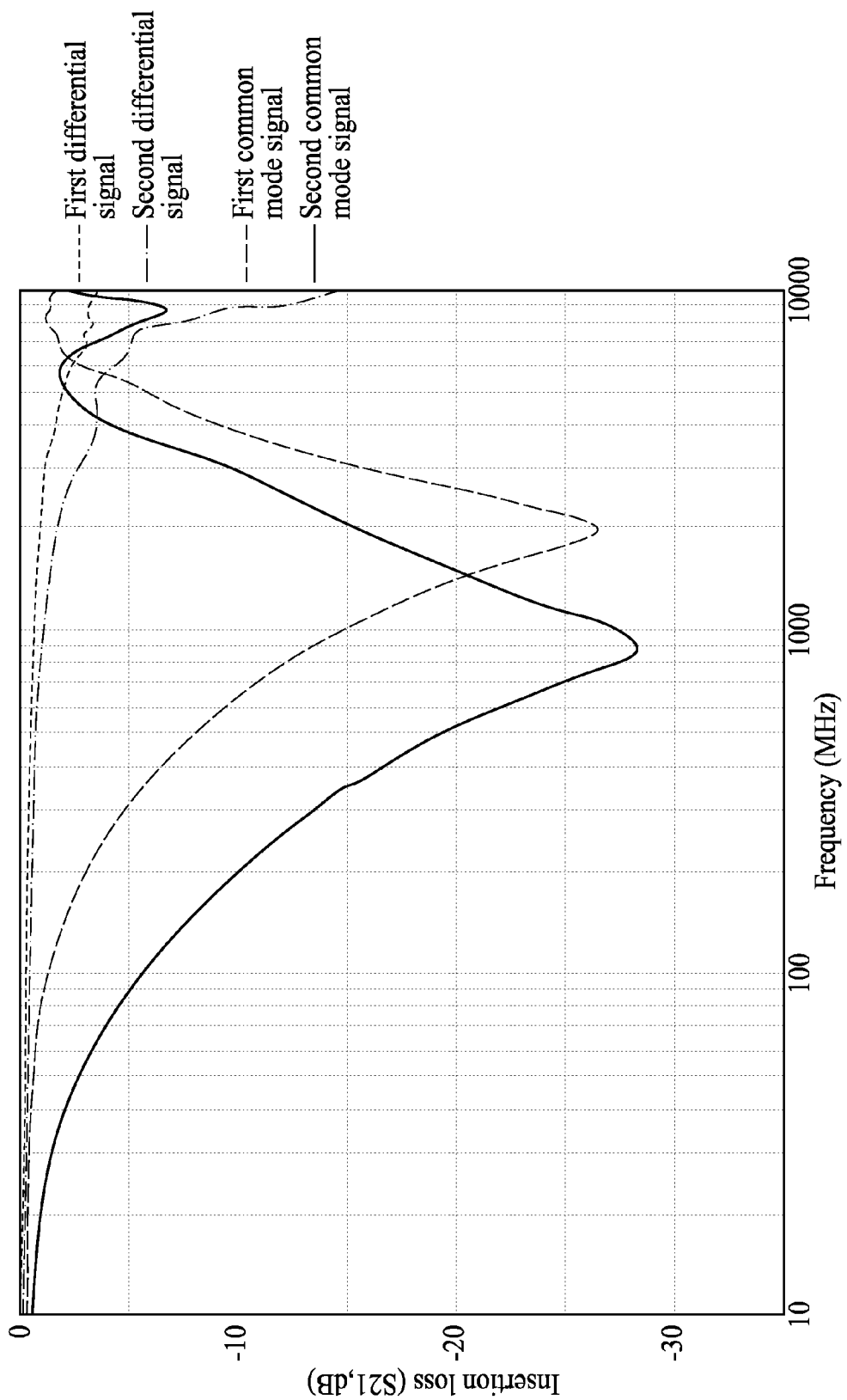
FIG. 2 illustrates the frequency responses of two common mode filters according to one embodiment of the present invention.

FIG. 2 illustrates the frequency responses of the first common mode filter 20 and the second common mode filter 30 according to one embodiment of the present invention. In one embodiment of the present invention, the first common mode filter 20 has a first filtering band and the second common mode filter 30 has a second filtering band, which is different from the first filtering band. In one embodiment of the present invention, when using the −15 dB as the filtering criteria, the first filtering band is between 350 MHz and 2,000 MHz, and the second filtering band is between 1,000 MHz and 3,000 MHz. In other words, the first filtering band overlaps a portion of the second filtering band.

In one embodiment of the present invention, when using the −15 dB as the filtering criteria, the first common mode filter 20 has a first low cut-off frequency of 350 MHz, which is lower than the second common mode filter 30 having a second low cut-off frequency of 1,000 MHz. In addition, when using the −15 dB as the filtering criteria, the first common mode filter 20 has a first high cut-off frequency of 2,000 MHz, which is also lower than the second common mode filter 30 having a second high cut-off frequency of 3,000 MHz.

Figure 3:
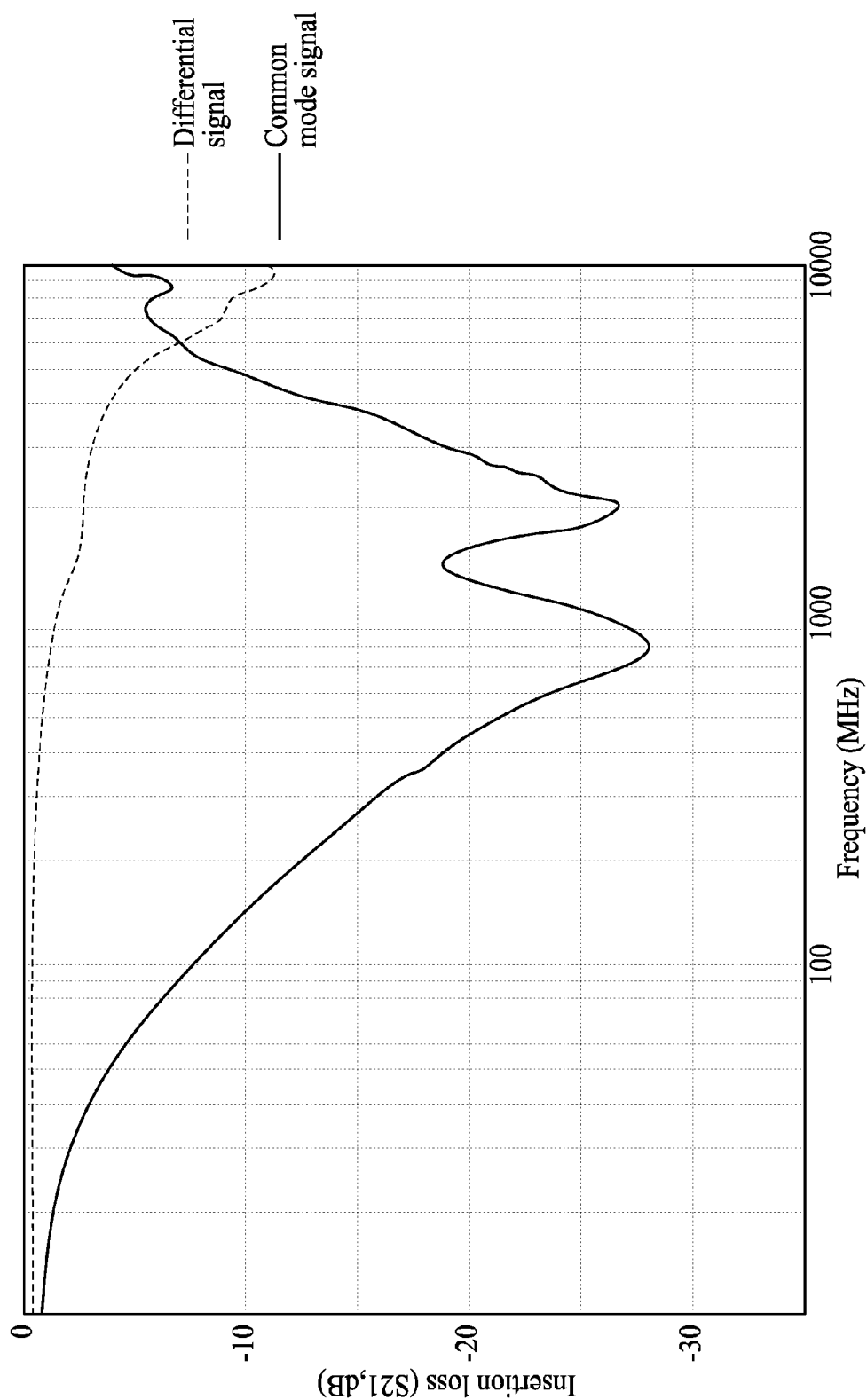
FIG. 3 illustrates an overall frequency response of a wide-band common mode filtering apparatus according to one embodiments of the present invention.

FIG. 3 illustrates an overall frequency response of the wide-band common mode filtering apparatus 10 according to one embodiments of the present invention. In one embodiment of the present invention, when using the −15 dB as the filtering criteria, the wide-band common mode filtering apparatus 10 has a low overall cut-off frequency of 280 MHz, which is lower than the first low cut-off frequency of 350 MHz. In addition, when using the −15 dB as the filtering criteria, the wide-band common mode filtering apparatus 10 has a high overall cut-off frequency of 4,000 MHz, which is higher than the second high cut-off frequency of 3,000 MHz. In one embodiment of the present invention, when using the −15 dB as the filtering criteria, the wide-band common mode filtering apparatus 10 has an overall filtering band between 280 MHz and 4,000 MHz, and the overall filtering band is wider than the first filtering band and the second filtering band.

After completing the fabrication process, the filtering band of the conventional common mode filter is fixed and cannot be expanded. In contrast, the wide-band common mode filtering apparatus 10 disclosed in the embodiment of the present invention comprises the at least two cascaded common mode filters 20, 30 with different noise-filtering responses, and the overall filtering band of the wide-band common mode filtering apparatus 10 is the superposition of the noise-filtering responses of the at least two cascaded common mode filters 20, 30, and the overall filtering band is wider than the individual filtering band of the common mode filter 20, 30.

For example, the conventional common mode filter can filter noise within a single frequency band, but cannot implement the multi-band filtering function. In contrast, the wide-band common mode filtering apparatus 10 possesses an expanded filtering band by cascading the at least two common mode filters 20, 30 with different noise-filtering responses, which implements the multi-band filtering function and can support the multi-band filtering requirement.

Furthermore, to meet the requirements of a new filtering band, the conventional common mode filter needs to be redesigned and re-fabricated. In contrast, the wide-band common mode filtering apparatus 10 disclosed in the embodiment of the present invention has an overall frequency response different from the frequency responses of the at least two cascaded common mode filters 20, 30, by way of the superposition of the individual frequency responses. In other words, the present disclosure can implement a new frequency response by cascading the common mode filters with desired frequency responses to meet the new requirement, and without conducting the redesign and re-fabrication process.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A wide-band common mode filtering apparatus, comprising:
    at least two cascaded common mode filters with different noise-filtering responses, wherein a cut-off frequency of the wide-band common mode filtering apparatus is at a lowest cut-off frequency of the at least two common mode filters, and a noise-filtering response of the wide-band common mode filtering apparatus is a superposition of the noise-filtering responses of the at least two common mode filters;
    a first common mode filter having a first filtering band; and
    a second common mode filter having a second filtering band different from the first filtering band, wherein the first common mode filter is cascaded to the second common mode filter;
    wherein the first filtering band overlaps a portion of the second filtering band.

2. The wide-band common mode filtering apparatus of claim 1, wherein the first common mode filter comprises a first pair of inputs and a first pair of outputs, the second common mode filter comprises a second pair of inputs and a second pair of outputs, and the second pair of inputs is connected to the first pair of outputs.

3. The wide-band common mode filtering apparatus of claim 1, wherein the first common mode filter has a first low cut-off frequency, the second common mode filter has a second low cut-off frequency, and the first low cut-off frequency is lower than the second low cut-off frequency.

4. The wide-band common mode filtering apparatus of claim 3, wherein the wide-band common mode filtering apparatus has a low overall cut-off frequency lower than the first low cut-off frequency.

5. The wide-band common mode filtering apparatus of claim 1, wherein the first common mode filter has a first high cut-off frequency, the second common mode filter has a second high cut-off frequency, and the second high cut-off frequency is higher than the first high cut-off frequency.

6. The wide-band common mode filtering apparatus of claim 5, wherein the wide-band common mode filtering apparatus has a high overall cut-off frequency higher than the second high cut-off frequency.

7. The wide-band common mode filtering apparatus of claim 1, wherein the wide-band common mode filtering apparatus has an overall filtering band, and the overall filtering band is wider than the first filtering band and the second filtering band.

8. The wide-band common mode filtering apparatus of claim 1, further comprising a third common mode filter having a third filtering band, wherein the third common mode filter is cascaded to the second common mode filter, and the third filtering band is different from the second filtering band.

9. The wide-band common mode filtering apparatus of claim 8, wherein the third common mode filter comprises a third pair of inputs and a third pair of outputs, and the third pair of inputs is connected to the second pair of outputs.

10. The wide-band common mode filtering apparatus of claim 8, wherein the third filtering band overlaps a portion of the second filtering band.

* * * * *